(12) United States Patent
Steinberg et al.

(10) Patent No.: US 12,132,137 B2
(45) Date of Patent: Oct. 29, 2024

(54) CONTINUOUS COMPOSITIONAL GRADING FOR REALIZATION OF LOW CHARGE CARRIER BARRIERS IN ELECTRO-OPTICAL HETEROSTRUCTURE SEMICONDUCTOR DEVICES

(71) Applicant: Mellanox Technologies, Ltd., Yokneam (IL)

(72) Inventors: Oren Steinberg, Tal Shahar (IL); Anders Gösta Larsson, Haovas (SE); Attila Fülöp, Gothenburg (SE); Elad Mentovich, Tel Aviv (IL); Isabelle Cestier, Haifa (IL); Moshe B. Oron, Rehovot (IL)

(73) Assignee: Mellanox Technologies, Ltd., Yokneam (IL)

( * ) Notice: Subject to any disclaimer, the term of this patent is extended or adjusted under 35 U.S.C. 154(b) by 169 days.

(21) Appl. No.: 17/881,927

(22) Filed: Aug. 5, 2022

(65) Prior Publication Data
US 2024/0047603 A1    Feb. 8, 2024

(51) Int. Cl.
*H01L 31/18*      (2006.01)
*H01L 31/0304*      (2006.01)
*H01L 31/109*      (2006.01)

(52) U.S. Cl.
CPC .... *H01L 31/1848* (2013.01); *H01L 31/03048* (2013.01); *H01L 31/109* (2013.01)

(58) Field of Classification Search
CPC .............. H01L 33/002; H01L 33/0025; H01L 31/1848; H01L 31/03048; H01L 31/109; H01L 29/66204
See application file for complete search history.

(56) References Cited

U.S. PATENT DOCUMENTS

| | | | |
|---|---|---|---|
| 5,408,487 A * | 4/1995 | Uchida | H01S 5/34313 372/45.01 |
| 10,401,543 B1 * | 9/2019 | Shi | G02B 5/22 |
| 2022/0102583 A1 * | 3/2022 | Baumheinrich | H01L 27/156 |

\* cited by examiner

*Primary Examiner* — Calvin Y Choi
(74) *Attorney, Agent, or Firm* — Moore & Van Allen PLLC; Anup Iyer (57) ABSTRACT

Processes for continuous compositional grading for realization of low charge carrier barriers in electro-optical heterostructure semiconductor devices are provided. An example process includes forming, onto one or more semiconductor layers of an electro-optical semiconductor device, a first semiconductor layer associated with a first bandgap value and forming, onto the first semiconductor layer, a grading layer associated with a continuous compositional grading. The example method further includes forming, onto the grading layer, a second semiconductor layer associated with a second bandgap value. The second bandgap value is different than the first bandgap value.

20 Claims, 5 Drawing Sheets

CONTINUOUS COMPOSITIONAL GRADING FOR REALIZATION OF LOW CHARGE CARRIER BARRIERS IN ELECTRO-OPTICAL HETEROSTRUCTURE SEMICONDUCTOR DEVICES

TECHNOLOGICAL FIELD

Embodiments of the present disclosure relate generally to systems and methods for continuous compositional grading for realization of low charge carrier barriers in electro-optical heterostructure semiconductor devices, wherein a first semiconductor layer associated with a first bandgap value is formed onto one or more semiconductor layers, a grading layer is formed onto the first semiconductor layer, and a second semiconductor layer associated with a second bandgap value is formed onto the grading layer.

BACKGROUND

Semiconductor chips are typically used in devices for conducting and directing electricity among components of the device. These chips are often formed of a plurality of layers, each of which are associated with various characteristic or parameters (e.g., bandgaps or the like). These semiconductor chips often attempt to provide continuous electron mobility, such that electrons are not trapped between different bandgaps which may in turn lead to lower speed in electron movement within the semiconductor and a reduced amount of electron collection. Through applied effort, ingenuity and innovation, various identified deficiencies and problems associated with semiconductor chips have been solved by developing solutions that are configured in accordance with the embodiments of the present disclosure, many examples of which are described in detail herein.

BRIEF SUMMARY

Example embodiments of the present disclosure relate generally to improved systems and methods for continuous compositional grading for realization of low charge carrier barriers in electro-optical heterostructure semiconductor devices, wherein at least two semiconductor layers may be formed onto one or more semiconductor layers while a grading layer is formed between a first semiconductor layer associated with a first bandgap and a second semiconductor layer associated with a second bandgap. The details of some embodiments of the subject matter described in this specification are set forth in the accompanying drawings and the description below. Other features, aspects, and advantages of the subject matter will become apparent from the description, the drawings, and the claims.

In accordance with some embodiments of the present disclosure, a method of creating a continuous compositional grading for realization of low charge carrier barriers in electro-optical heterostructure semiconductor devices is provided. The method may include forming, onto one or more semiconductor layers of an electro-optical semiconductor device, a first semiconductor layer associated with a first bandgap value. The method may further include forming, onto the first semiconductor layer, a grading layer associated with a continuous compositional grading and forming, onto the grading layer, a second semiconductor layer associated with a second bandgap value. The second bandgap value may be different than the first bandgap value.

In accordance with another aspect of the present disclosure, the method of creating a continuous compositional grading for realization of low charge carrier barriers in electro-optical heterostructure semiconductor devices may further include the aspect of forming the grading layer onto the first semiconductor layer by forming the grading layer onto the first semiconductor layer via an epitaxial growth technique.

In accordance with another aspect of the present disclosure, the method of creating a continuous compositional grading for realization of low charge carrier barriers in electro-optical heterostructure semiconductor devices may further include the aspect of forming the grading layer onto the first semiconductor layer by tuning one or more mass flow controllers to control a rate of application of a source material of the grading layer onto the first semiconductor layer.

In accordance with another aspect of the present disclosure, the method of creating a continuous compositional grading for realization of low charge carrier barriers in electro-optical heterostructure semiconductor devices may further include the aspect of the first semiconductor layer being an indium phosphide (InP) layer, and the second semiconductor layer being an indium gallium arsenide (InGaAs layer) layer. The method may further include the forming of the grading layer by forming the grading layer between the InP layer and the InGaAs layer.

In accordance with another aspect of the present disclosure, the method of creating a continuous compositional grading for realization of low charge carrier barriers in electro-optical heterostructure semiconductor devices may further include the aspect of the first semiconductor layer being an indium phosphide (InP) layer, and the second semiconductor layer being an indium gallium arsenide phosphide (InGaAsP) layer. The method may further include the forming of the grading layer by forming the grading layer between the InP layer and the InGaAsP layer.

In accordance with another aspect of the present disclosure, the method of creating a continuous compositional grading for realization of low charge carrier barriers in electro-optical heterostructure semiconductor devices may further include the aspect of the first semiconductor layer being an indium phosphide (InP) layer, and the second semiconductor layer being an indium gallium aluminum arsenide (InGaAlAs) layer. The method may further include the forming of the grading layer by forming the grading layer between the InP layer and the InGaAlAs layer.

In accordance with another aspect of the present disclosure, the method of creating a continuous compositional grading for realization of low charge carrier barriers in electro-optical heterostructure semiconductor devices may further include the aspect of the first semiconductor layer being an indium gallium arsenide phosphide (InGaAsP) layer, and the second semiconductor layer being an indium gallium arsenide (InGaAs layer). The method may further include the forming of the grading layer by forming the grading layer between the InGaAsP layer and the InGaAs layer.

In accordance with another aspect of the present disclosure, the method of creating a continuous compositional grading for realization of low charge carrier barriers in electro-optical heterostructure semiconductor devices may further include the aspect of the first semiconductor layer being an indium gallium arsenide phosphide (InGaAsP) layer, and the second semiconductor layer being an indium gallium aluminum arsenide (InGaAlAs) layer. The method may further include the forming of the grading layer by forming the grading layer between the InGaAsP layer and the InGaAlAs layer.

In accordance with another aspect of the present disclosure, the method of creating a continuous compositional grading for realization of low charge carrier barriers in electro-optical heterostructure semiconductor devices may further include the aspect of the first semiconductor layer being an aluminum gallium arsenide (AlGaAs) layer, and the second semiconductor layer being a gallium arsenide (GaAs) layer. The method may further include the forming of the grading layer by forming the grading layer between the AlGaAs layer and the GaAs layer.

In accordance with another aspect of the present disclosure, the method of creating a continuous compositional grading for realization of low charge carrier barriers in electro-optical heterostructure semiconductor devices may further include the aspect of the first semiconductor layer being an aluminum gallium arsenide phosphide (AlGaAsP) layer, and the second semiconductor layer being a gallium arsenide (GaAs) layer. The method may further include the forming of the grading layer by forming the grading layer between the AlGaAsP layer and the GaAs layer.

In accordance with another aspect of the present disclosure, the method of creating a continuous compositional grading for realization of low charge carrier barriers in electro-optical heterostructure semiconductor devices may further include the aspect of the first semiconductor layer being a silicon (Si) layer, and the second semiconductor layer being a silicon germanium (SiGe) layer. The method may further include the forming of the grading layer by forming the grading layer between the Si layer and the SiGe layer.

In accordance with another aspect of the present disclosure, the method of creating a continuous compositional grading for realization of low charge carrier barriers in electro-optical heterostructure semiconductor devices may further include the aspect of the first semiconductor layer being an aluminum gallium nitride (AlGaN) layer, and the second semiconductor layer being a gallium nitride (GaN) layer. The method may further include the forming of the grading layer by forming the grading layer between the AlGaN layer and the GaN layer.

In accordance with another aspect of the present disclosure, the method of creating a continuous compositional grading for realization of low charge carrier barriers in electro-optical heterostructure semiconductor devices may further include the aspect of the first semiconductor layer being a gallium nitride (GaN) layer, and the second semiconductor layer being an indium gallium nitride (InGaN) layer. The method may further include the forming of the grading layer by forming the grading layer between the GaN layer and the InGaN layer.

In accordance with some embodiments of the present disclosure, an electro-optical semiconductor device is provided, the electro-optical semiconductor device may include a first semiconductor layer disposed on one or more semiconductor layers. The method may further include the first semiconductor layer including a first bandgap value. The method may further include a grading layer disposed on the first semiconductor layer. The method may further include the grading layer including a continuous compositional grading. The method may further include a second semiconductor layer disposed on the grading layer, the second semiconductor layer may include a second bandgap value, and the second bandgap value may be a different bandgap value than the first bandgap value.

In accordance with another aspect of the present disclosure, the electro-optical semiconductor device may further include the aspect of the difference between the first bandgap and the second bandgap is greater than or equal to 0.1 eV.

In accordance with another aspect of the present disclosure, the electro-optical semiconductor device may further include the aspect of the continuous compositional grading corresponding to a linear compositional grading between the first semiconductor layer and the second semiconductor layer.

In accordance with another aspect of the present disclosure, the electro-optical semiconductor device may further include the aspect of the continuous compositional grading include a step size that is equal to or approximately equal to zero.

In accordance with some embodiments of the present disclosure, a transceiver device is provided, the transceiver device including an electro-optical semiconductor device which may include a first semiconductor layer disposed on one or more semiconductor layers. The transceiver device may further include that the first semiconductor layer includes a first bandgap value. The transceiver device may further include a grading layer disposed on the first semiconductor layer, the grading layer including a continuous compositional grading. The transceiver device may further include a second semiconductor layer disposed on the grading layer, the second semiconductor layer including a second bandgap value that is different than the first bandgap value, and the electro-optical semiconductor device is configured to generate output data based on an optical input signal received by the electro-optical semiconductor device. The transceiver device may further include a controller device operably coupled with the electro-optical semiconductor device and configured to process the output data generated by the electro-optical semiconductor device.

In accordance with another aspect of the present disclosure, the transceiver device may further include the aspect where a difference between the first bandgap and the second bandgap is greater than or equal to 0.1 eV.

In accordance with another aspect of the present disclosure, the transceiver device may further include the aspect where continuous compositional grading includes a step size that is equal to or approximately equal to zero.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. As used herein, terms such as "front," "rear," "top," "inside," "outside," "inner," "outer," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

A layered structure described herein may generally be understood to be a stack of materials that is used to create a semiconductor device. For example, such materials may include a plurality of peripheral layers, an absorption layer, and a collector region including drift and collector layers. Within this layered structure free electrons and free holes may be trapped within the materials. Such a layered structure and its individual materials are described more fully below with respect to FIGS. 1A, 1B, and 2.

Various embodiments of the present disclosure are provided to overcome and/or mitigate the issues with semiconductors that include different layers and materials of different bandgaps where free electrons and free holes may be trapped as they move from one material to another in generating conductivity. For instance, in a system of an InP-based Photo Diode (PD), with a InGaAs alloy—which is lattice-matched to the InP—with the InGaAs alloy acting as the absorbing layer and the InP layer acting as the collector layer, there may be a bandgap difference of at least 0.6 eV (e.g., the bandgap of the InGaAs lattice matched to the InP is 0.75 eV and the bandgap of InP is 1.35 eV, at room temperature) that may trap a free electron or free hole as it moves through the layered structure of the semiconductor.

In some embodiments, and for high-speed PD devices, a potential speed limiting effect may be the trapping of photogenerated electrons and holes at the InGaAs/InP interfaces where the potential barriers are large in both the conduction band (e.g., 240 meV) and the valence band (360 meV). In this manner, the photogenerated electrons and holes (i.e., free electrons and free holes) may be trapped and/or slowed down by the potential barriers in both the conduction band and the valence band.

Figure 1A:
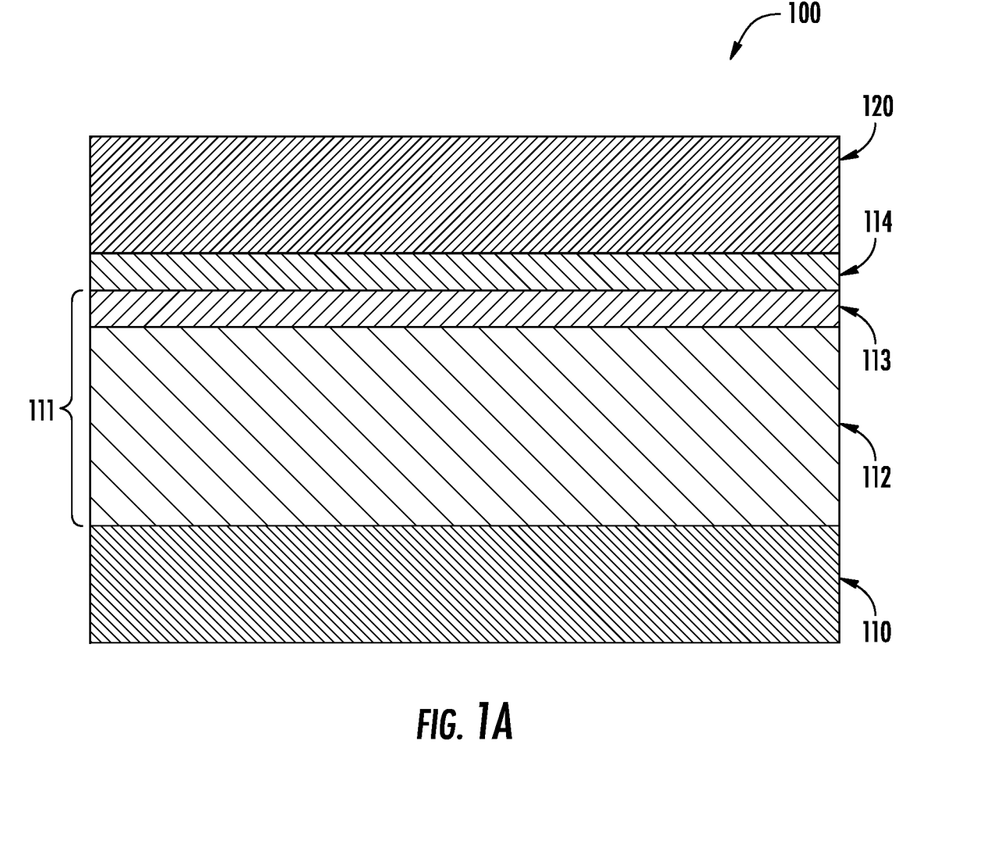
FIG. 1A illustrates an example cross-section view of a layered structure used to generate a semiconductor device, in accordance with one or more embodiments of the present disclosure.
Figure 1B:
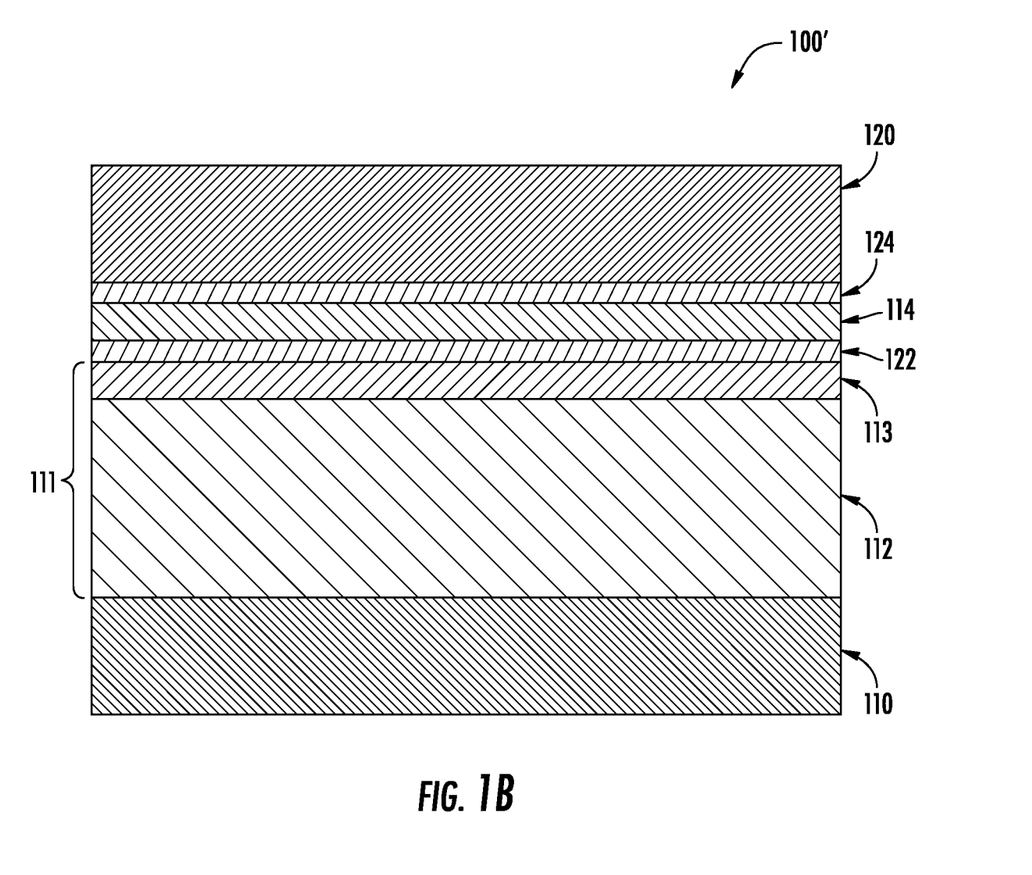
FIG. 1B illustrates an example cross-section view of a layered structure including a plurality of grading layers used to generate a semiconductor device, in accordance with one or more embodiments of the present disclosure.

In various embodiments, the layered structure including continuous grading layers are formed within a layered structure that is used to generate a semiconductor, such as that shown explicitly in FIG. 1B and implicitly in FIG. 1A. In some embodiments, the layered structure may be provided by with photodetector device such that light may be captured by the photodetector and fed into the layered structure. In various embodiments, the layered structure includes at least one separate light absorption region (e.g., absorption layer) and at least one collector region comprising drift/collector layers. For example, in various embodiments, the layered structure includes the absorber region (i.e., comprising the absorption layer) and the collector region. Although these regions do not overlap, but they touch such that electrons may move between the absorber region and the collector region.

In some embodiments, a drift layer 113 may be doped so as to control the electric fields in the absorption region 114 and the collector region 111 (e.g., which comprises drift layer 113 and collection layer 112). For example, the drift layer 113 may be doped so that when an appropriate bias voltage is applied to the photodetector comprising the layered structure, an electric field is generated within the collector layer 112 and the absorption region 114. The electric filed causes the collector layer 112, drift layer 113, collection region 111, absorption layer 114, and/or absorption region 114 to be substantially depleted of free charge carriers (i.e., the charge carriers which carry the free electrons and free holes within the layered structure).

Figure 2:
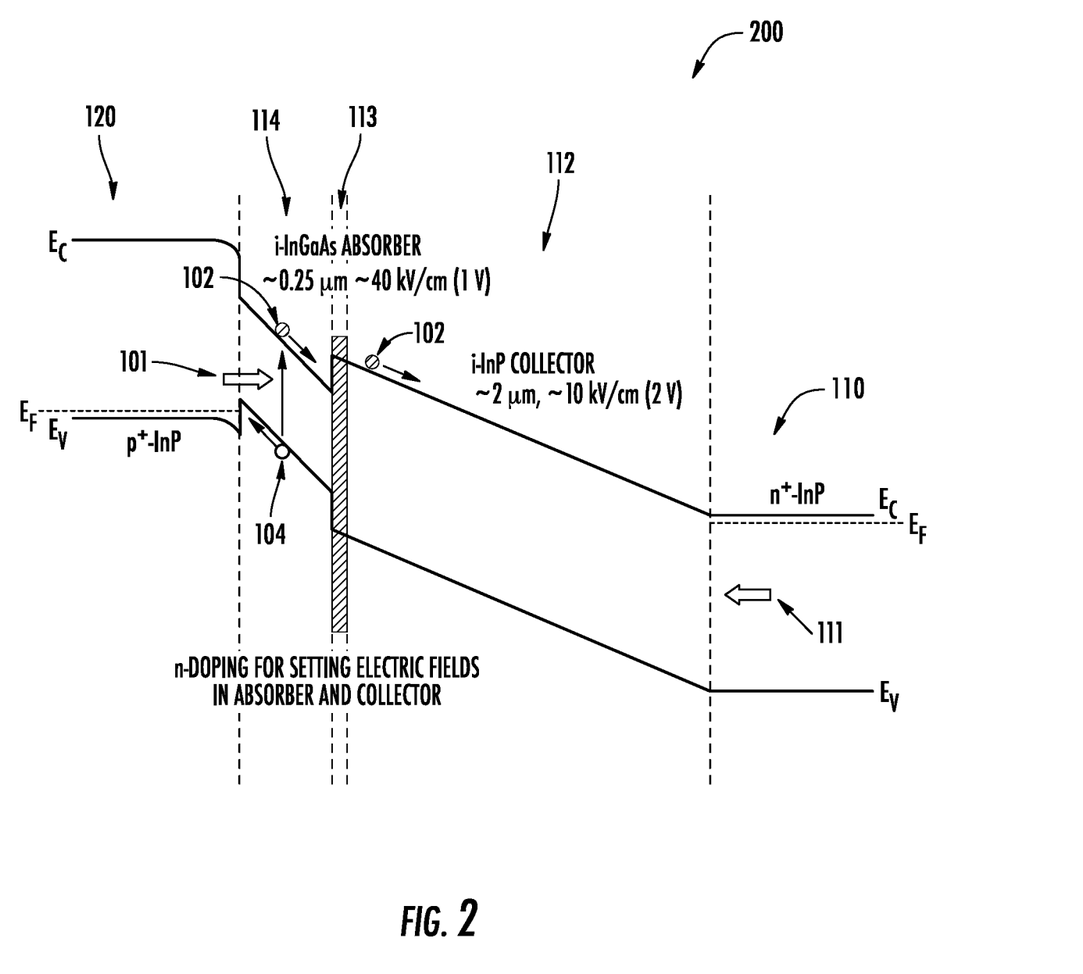
FIG. 2 illustrates an example bandgap diagram for the example layered structure of FIG. 1A, in accordance with one or more embodiments of the present disclosure.

FIG. 1A illustrates an example cross-section view of a layered structure that does not explicitly show a plurality of continuous grading layers (e.g., 124 and 122 as shown in FIG. 1B). FIG. 1B illustrates an example cross-section view of a layered structure 100' comprising a plurality of grading layers 122 and 124, where the plurality of grading layers 122 and 124 are provided within the layered structure to provide a graded structure for the electron and hole movement, in accordance with one or more embodiments of the present disclosure. FIG. 2 illustrates an example bandgap diagram for the example layered structure of FIG. 1A, that indicates the various areas of bandgaps associated with the layers of the layered structure of FIG. 1A.

In some embodiments, the layered structure comprising the grading layers 100' and the layered structure that include the grading layers 124 and 122, may be configured to detect light in a particular wavelength range, such as the wavelength range of 940-1150 nm. In some embodiments, the contact layers of the light (e.g., the peripheral layers 110 and/or 120 of FIGS. 1A and 1B) may be transparent so as to allow light to pass through such that the light is transferred to the absorption region 114. In some embodiments, and similar to the peripheral layers, the collector region 111 (e.g., the collector layer 112 and drift layer 113 also referred to as the intermediate layer) may be transparent so the light is not absorbed in the collection region if it is first contacted at peripheral layer 110. For instance, light may be contacted through a top peripheral layer (e.g., peripheral layer 120) that is directly adjacent to the absorption layer 114 and transmitted to the absorption layer 114, or light may be contacted through the bottom peripheral layer 110 and carried through the collector region (112 and 113) to the absorption region 114. In some embodiments, and once the light has been absorbed in the absorption layer 114, electrons and holes may be generated within the absorption layer 114.

By way of a non-limiting example, FIG. 2 illustrates a band diagram 200 for the layered structure of FIG. 1A. The band diagram 200 illustrates the conductor band energy $E_C$, valence band energy $E_V$, Fermi energy $E_F$ across the layered structure of FIG. 1A. In some embodiments, and as light enters the layered structure (such as an optical beam, optical signal, and/or the like characterized by a particular wavelength range and/or one or more wavelengths within the particular wavelength range) the light may be transferred through the layered structure until it reaches the absorption region which may use the light to generate a plurality of electrons and holes. For instance, the light 101 may enter through the top peripheral region 120 and/or the light 111 may enter through the bottom peripheral region 110. In both embodiments, the light (e.g., 101 and 111) may flow to the absorption region 114 without being captured either by the peripheral regions (120 and 110) or the collector region 111 (which may include drift layer 112 and collection layer 113) if contacted through the bottom peripheral region 110. As light enters the absorption region 114, free electrons (e.g., shown as electron 102) and free holes (e.g., shown as hole 104) are generated. The free electrons may then be accelerated from the absorption region 114 to the collector region 111 toward the bottom peripheral layer 110 by the electric fields within the absorption region 114 and the collector region 111 which is controlled by the drift layer 113. The free holes, in contrast, are accelerated toward the top peripheral layer 120 by the electric field within the absorption region 114 which is controlled by the drift layer 113. However, this process of accelerating the free electrons 102 and free holes 104 is mitigated, stalled, and/or halted, by the bandgap differentials between the absorption region and the collector region 111 or the top peripheral region 120, respectively.

In some embodiments, a grading layer 124 may be formed onto at least the top peripheral layer 120 abutting the absorption region and/or the collection region 111, wherein the grading layer is generated by a continuous compositional grading between the materials of at least the top peripheral layer 120 and/or collection region 111, and the absorption region 114. Such a grading layer may include a plurality of grading layers within the layered structure such as grading layer 122 and grading layer 124. Alternatively, in some embodiments, only one grading layer may be used in the layered structure. The grading layer 124 may be formed by the top peripheral layer 120, and the absorption layer 114 may be grown on the grading layer 124. In some embodiments, only the grading layer 122 may be grown within the layered structure, such that the grading layer 122 is formed on the collection region 111, and the absorption layer 114 is likewise grown on the grading layer 122. In any event, the layered structure 100' as illustrated in FIG. 1B, may be grown in an ascending direction (e.g., from layer 110 to layer 120). Such disclosure of methods to grow the grading layer(s) 122 and 124 are described in further detail below with respect to FIG. 3.

Figure 3:
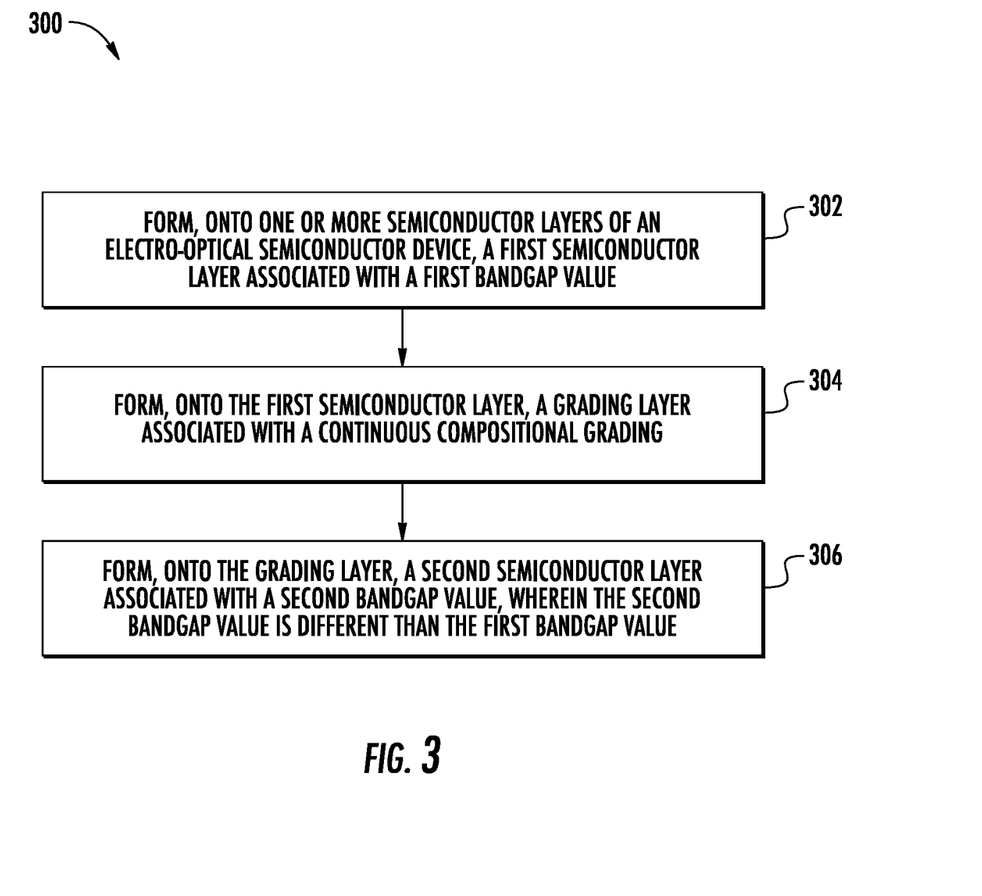
FIG. 3 illustrates an example flowchart of the process to generate the layered structure, in accordance with one or more embodiments of the present disclosure.

FIG. 3 illustrates an example flowchart of the process to generate the layered structure comprising at least one grading layer which is used to generate a semiconductor device. As shown in block 302, the method 300 may include forming, onto one or more semiconductor layers of an electro-optical semiconductor device, a first semiconductor layer associated with a first bandgap value. By way of non-limiting example, the first semiconductor layer may be formed onto one or more other semiconductor layers, such as a substrate layer and/or a peripheral layer (e.g., peripheral layer 110) such that the first semiconductor is the collection region 112 and 113 and/or a layer between the peripheral layer 120. In some embodiments, such a substrate layer and/or peripheral layer (e.g., peripheral layer 110) used to form the first semiconductor layer may include InP, silicon (Si), and/or the like. In some embodiments, the InP may be p-doped or n-doped depending on the purpose for which the substrate is used for (e.g., the peripheral layer may have a different doping than the collection region).

In some embodiments, the absorber region 115 includes at least one of InGaAs, InGaAsP, InGaAlAs, AlGaAs, AlGaAsP, SiGe, AlGaN, and/or InGaN. In some embodiments, such a listing of materials for the absorber region includes materials of a lower bandgap than the surrounding peripheral region (e.g., the top peripheral region 120), the collector region (e.g., drift layer 113 and collection layer 112), and/or the peripheral region located remote from the absorption region (e.g., peripheral region 110). In some embodiments, the absorption region 114 includes intrinsic (and/or un-doped) InGaAs, InGaAsP, InGaAlAs, AlGaAs, AlGaAsP, SiGe, AlGaN, and/or InGaN; and/or doped InGaAs, InGaAsP, InGaAlAs, AlGaAs, AlGaAsP, SiGe, AlGaN, and/or InGaN. In some embodiments, and as described more fully below with respect to FIG. 3, the layered structure 100, 100' is formed on an InP substrate, such as the at least one of the peripheral regions (e.g., 120 or 110) comprising InP or the collection region (e.g., 112 and 113) comprising InP, such that each layer of the layered structure 100, 100' (e.g., the absorption region 114) are lattice-matched to InP. In some embodiments, such a layer comprising InP (e.g., peripheral region 120 and/or 110 and/or collection region 112 and 113) may be doped to introduce impurities to the materials, wherein the doping may include a p-doping or an n-doping.

In some embodiments, the first semiconductor layer may include materials such as InP, indium gallium arsenide phosphide (InGaAsP), gallium arsenide (GaAs), silicon (Si), gallium nitride (GaN), and/or the like. Such materials used to form the first semiconductor layer may include a first bandgap, such as a larger bandgap as compared to a bandgap of an absorption region 114.

In some embodiments, the disclosure provided herein may include an electro-optical semiconductor device that provides that the first semiconductor layer's bandgap and the second semiconductor's bandgap is greater than or equal to 0.1 eV. Thus, in some embodiments, the difference may include 0.1 eV, 0.11 eV, 0.12 eV, 0.13 eV, 0.14 eV, 0.15 eV, 0.16 eV, 0.17 eV, eV, 0.19 eV, 0.2 eV, and/or the like. In some embodiments, the differential between the first semiconductor layer and the second semiconductor layer may include steps of 0.01 eV, 0.001 eV, eV, 0.00001 eV, 0.000001 eV, and/or the like. The first semiconductor layer may, in some embodiments, be deposited onto a substrate via chemical vapor deposition (CVD).

As shown in block 304, method 300 may include forming, onto the first semiconductor layer, a grading layer associated with a continuous compositional grading. In some embodiments, the grading layer may be formed onto the first semiconductor layer by gradually applying the material of the second semiconductor layer missing from the first semiconductor layer to the first semiconductor layer. In some embodiments, this continuous grading to generate the grading layer is done by an epitaxy process such as a metal organic chemical vapor deposition (e.g., MOCVD) process, a molecular beam epitaxy (MBE) process, and/or other epitaxy process known in the art.

For instance, a MOCVD process may include the deposition of thin layers of atoms onto the first semiconductor layer. By way of non-limiting example, the grading layer may include a total thickness of between and including approximately 50-500 nm.

By way of non-limiting example, if the first semiconductor layer is InP and the intended second semiconductor layer is InGaAs, then the grading layer material within the epitaxy process may include only InP molecules as an initial grading layer material. For instance, the epitaxy process may be controlled by a chemical equation directed to the second semiconductor layer such as $In_{1-x}Ga_xAs_yP_{1-y}$ wherein the initial values of x and y are zero (e.g., x=0 and y=0) such that only InP is formed into the epitaxy process, and as the epitaxy process continues, the x value and the y value are gradually increased.

In embodiments in which the first semiconductor layer is InP and the second semiconductor layer is InGaAsP, the grading layer material within the epitaxy process may include only InP molecules as an initial grading layer material. For instance, the epitaxy process may be controlled by a chemistry equation directed to the second semiconductor layer such as $In_{1-x}Ga_xAs_yP_{1-y}$ wherein the initial values of x and y are zero (e.g., x=0 and y=0) such that only InP is formed into the epitaxy process, and as the epitaxy process continues, the x value, the y value, and the z value are gradually increased.

In embodiments in which the first semiconductor layer is InP and the second semiconductor layer is InGaAlAs, the grading layer material within the epitaxy process may include only InP molecules as an initial grading layer material. For instance, the epitaxy process may be controlled by a chemistry equation directed to the second semiconductor layer such as $In_{1-x-y}Ga_xAl_yAs_zP_{1-z}$ wherein the initial values of x, y, and z are zero (e.g., x=0, y=0, and z=0) such that only InP is formed into the epitaxy process, and as the epitaxy process continues, the s, x, y, and z values are gradually increased.

In those embodiments where the first semiconductor layer is InGaAsP and the second semiconductor layer is InGaAs, then the grading layer material within the epitaxy process may include only InGaAsP molecules as an initial grading layer material. For instance, the epitaxy process may be controlled by a chemical equation directed to the second semiconductor layer such as $In_{1-x}Ga_xAs_yP_{1-y}$ wherein the initial value of x and y are zero (e.g., x=0 and y=0) such that only InGaAs is formed into the epitaxy process, and as the epitaxy process continues, the x value is gradually increased.

In those embodiments where the first semiconductor layer is InGaAsP and the second semiconductor layer is InGaAlAs, then the grading layer material within the epitaxy process may include only InGaAsP molecules as an initial grading layer material. For instance, the epitaxy process may be controlled by a chemistry equation directed to the second semiconductor layer such as $In_{1-x-y}Ga_xAl_yAs_zP_{1-z}$, wherein the initial values of x, y, and z are zero (e.g., x=0, y=0, and z=0) such that only InGaAsP is formed into the epitaxy process, and as the epitaxy process continues, the x value and the y value are gradually increased.

In those embodiments where the first semiconductor layer is GaAs and the second semiconductor layer is AlGaAsP, then the grading layer material within the epitaxy process may include only GaAs molecules as an initial grading layer material. For instance, the epitaxy process may be controlled by a chemistry equation directed to the second semiconductor layer such as $Ga_{1-x}Al_xAs_{1-y}P_y$, wherein the initial values of x and y (e.g., x=0 and y=0) such that only InGaAsP is formed into the epitaxy process, and as the epitaxy process continues, the x value and the y value are gradually increased.

In those embodiments where the first semiconductor layer is Si and the second semiconductor layer is SiGe, then the grading layer material within the epitaxy process may include only Si molecules as an initial grading layer material. For instance, the epitaxy process may be controlled by a chemistry equation directed to the second semiconductor layer such as $Si_{1-x}Ge_x$ wherein the initial value of x is zero (e.g., x=0) such that only Si is formed into the epitaxy process, and as the epitaxy process continues, the x value is gradually increased.

In those embodiments where the first semiconductor layer is GaN and the second semiconductor layer is AlGaN, then the grading layer material within the epitaxy process may include only GaN molecules as an initial grading layer material. For instance, the epitaxy process may be controlled by a chemistry equation directed to the second semiconductor layer such as $Al_xGa_{1-x}N$ wherein the initial value of x is zero (e.g., x=0) such that only GaN is formed into the epitaxy process, and as the epitaxy process continues, the x value is gradually increased.

In those embodiments where the first semiconductor layer is GaN and the second semiconductor layer is InGaN, then the grading layer material within the epitaxy process may include only GaN molecules as an initial grading layer material. For instance, the epitaxy process may be controlled by a chemistry equation directed to the second semiconductor layer such as $Al_xGa_{1-x}N$ wherein the initial value of x is zero (e.g., x=0) such that only GaN is formed into the epitaxy process, and as the epitaxy process continues, the x value is gradually increased.

As shown in block 306, method 300 may include forming, onto the grading layer, a second semiconductor layer associated with a second bandgap value, wherein the second bandgap value is different than the first bandgap value. By way of non-limiting example, the second semiconductor layer may be generated by slowly introducing the materials of the second semiconductor layer within the epitaxy process. For instance, and as discussed above, if the first semiconductor layer is InP and the second semiconductor layer is InGaAs, then the materials of the first semiconductor layer that differ from the second semiconductor layer (e.g., phosphide, P) may be gradually removed from within the epitaxy process such that the grading layer by the end of the grading layer formation only includes the second semiconductor layer materials. By way of completion of disclosure, such process of the formation of the second semiconductor layer may be used for at least each of the first semiconductor layer materials, grading layer materials, and second semiconductor layers as described above (e.g., InP, InGaAs, InGaAsP, InGaAlAs, GaAs, AlGaAs, AlGaAsP, Si, SiGe, GaN, AlGaN, InGaN, and/or the like).

Figure 4A:
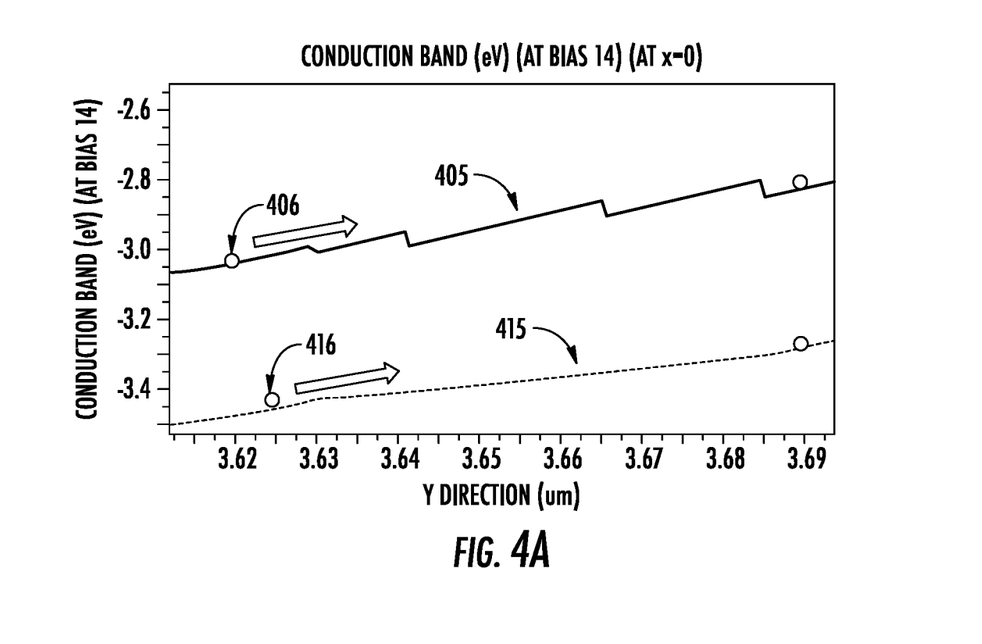
FIG. 4A illustrates a conduction band diagram of the layered structure's performance of the conduction band, in accordance with one or more embodiments of the present disclosure.

FIG. 4A illustrates a conduction band diagram of the layered structure's performance of the conduction band with respect to an electron's movement in a layered structure comprising a plurality of grading layers as compared to the electron's movement in the layered structures that do not include a plurality of grading layers. By way of non-limiting example, the present disclosure provides an improvement over the prior art by providing a continuous grading between semiconductor layers comprising different bandgaps (e.g., a first semiconductor layer and the second semiconductor layer). For instance, FIG. 4A provides a graph-line 415 to show an electron's 416 movement within a layered structure used to generate a semiconductor, wherein the layered structure includes a grading layer. For instance, line 415 shows that the electron 416 may move in an unimpeded manner across a y-direction (e.g., between semiconductor layers such as absorption region 114 and the collection region 113 and 112 toward the peripheral region 110 and/or the free holes toward the peripheral region 120). For instance, line 405 indicating a step structure between the semiconductor layers (e.g., a first semiconductor layer and a second semiconductor layer) shows a potential trapping (e.g., by bumps and/or differences in bandgap height) of the electrons (406) as they move along the x-axis.

Figure 4B:
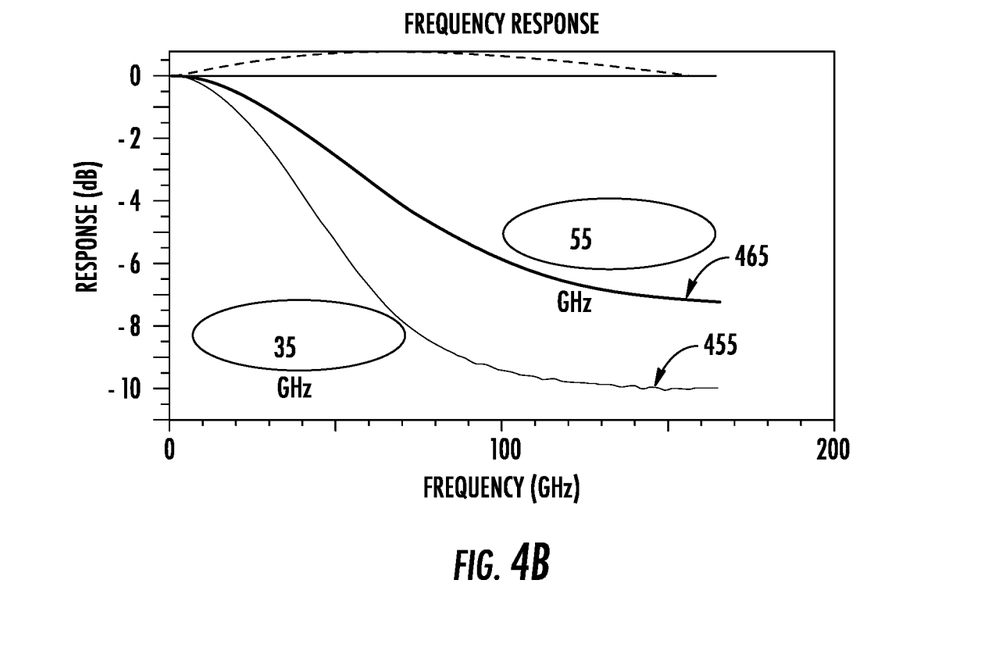
FIG. 4B illustrates a frequency response comparison of the layered structure's performance, in accordance with one or more embodiments of the present disclosure.

FIG. 4B illustrates the frequency response comparison of the layered structure's performance in frequency response, wherein the layered structure includes a plurality of grading layers as compared to the frequency response in the layered structures that do not include a plurality of grading layers. By way of non-limiting example, FIG. 4B depicts the frequency response of the layered structure where grading layers have been formed to help electrons and holes move through the layered structure at better frequency responses, as shown as line 465 indicating higher response over different frequencies. In comparison, layered structures not comprising any grading layers has a lower frequency response (e.g., line 435 indicating lower response values—decibels—over different frequencies). By way of non-limiting example, such a continuous compositional grading (e.g., like that shown as FIGS. 1A and 1B]) results in an improved frequency response relative to non-continuous compositional grading (e.g., such as the frequency response shown as line 435 of FIG. 4).

Further, and as described above with respect to FIG. 3, a MOCVD system may act to control the introduction of certain materials from the source materials to form the first semiconductor layer, the grading layer, and/or the second semiconductor layer (e.g., controlling the insertion of InP materials for the first semiconductor layer, the insertion of the InGaAsP materials to form the grading layer, and/or the insertion of the InGaAs materials to form the second semiconductor layer) by controlling the insertion of the materials based on the chemical equations discussed above. By way of a non-limiting example, the continuous grading layer(s) may be generated by a continuous composition grading process having a change rate of approximately 0 eV to 0.2 eV between grading layers.

Based on the continuous compositional grading process and the epitaxy processes described herein to form the grading layer(s), a step size between the layers of the continuous grading layer is approximately equal to zero (i.e., the grading layer is continuous and does not include any steps that could mitigate electron or hole movement). For instance, and as discussed herein with respect to the layered structure described in FIGS. 1A and 1B, the example bandgap diagram described in FIG. 2, and the method described in FIG. 3, the continuous compositional grading process may be designed to generate a continuous grading layer(s) between a first semiconductor layer and a second semiconductor layer such that the difference between each layer within the continuous grading layer is approximately equal to 0 eV (e.g., such as in steps of 0.00001 eV, 0.0001 eV, 0.001 eV, 0.01 eV, and/or the like). In contrast, a non-continuous compositional grading may include grading layers of at least 0.02 eV).

In some embodiments, each layer of the continuous grading layer may comprise a difference between surrounding layers of the continuous grading layers so miniscule such that the continuous grading layer is functionally continuous and allows the electrons and/or holes to move along an un-impeded path. In this manner, the grading layer(s) of the continuous grading layer should include a depth as close to the depth of the layers directly adjacent to the grading layer in each instance (e.g., a bandgap step in the range between approximately 0 eV and 0.02 eV). For instance, each grading layer may comprise a depth similar to or the same as the grading layer(s) surrounding each grading layer (i.e., each grading layer comprises a similar depth to the grading layer(s) directly adjacent to each grading layer.

Many modifications and other embodiments of the disclosure set forth herein will come to mind to one skilled in the art to which these disclosures pertain having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purpose of limitation.

The invention claimed is:

1. A method comprising:
forming, onto one or more semiconductor layers of an electro-optical semiconductor device, a first semiconductor layer associated with a first bandgap value;
forming, onto the first semiconductor layer, a grading layer comprising a plurality of layers defining a continuous compositional grading; and
forming, onto the grading layer, a second semiconductor layer associated with a second bandgap value,
wherein the second bandgap value is different than the first bandgap value.

2. The method of claim 1, wherein the grading layer is formed onto the first semiconductor layer via an epitaxial growth technique.

3. The method of claim 1, wherein forming the grading layer onto the first semiconductor layer comprises tuning one or more mass flow controllers to control a rate of application of a source material of the grading layer onto the first semiconductor layer.

4. The method of claim 1, wherein the first semiconductor layer is an indium phosphide (InP) layer, and the second semiconductor layer is an indium gallium arsenide (InGaAs layer) layer, and wherein forming the grading layer comprises forming the grading layer between the InP layer and the InGaAs layer.

5. The method of claim 1, wherein the first semiconductor layer is an indium phosphide (InP) layer, and the second semiconductor layer is an indium gallium arsenide phosphide (InGaAsP) layer, and wherein forming the grading layer comprises forming the grading layer between the InP layer and the InGaAsP layer.

6. The method of claim 1, wherein the first semiconductor layer is an indium phosphide (InP) layer, and the second semiconductor layer is an indium gallium aluminum arsenide (InGaAlAs) layer, and wherein forming the grading layer comprises forming the grading layer between the InP layer and the InGaAlAs layer.

7. The method of claim 1, wherein the first semiconductor layer is an indium gallium arsenide phosphide (InGaAsP) layer, and the second semiconductor layer is an indium gallium arsenide (InGaAs layer), and wherein forming the grading layer comprises forming the grading layer between the InGaAsP layer and the InGaAs layer.

8. The method of claim 1, wherein the first semiconductor layer is an indium gallium arsenide phosphide (InGaAsP) layer, and the second semiconductor layer is an indium gallium aluminum arsenide (InGaAlAs) layer, and wherein forming the grading layer comprises forming the grading layer between the InGaAsP layer and the InGaAlAs layer.

9. The method of claim 1, wherein the first semiconductor layer is an aluminum gallium arsenide (AlGaAs) layer, and the second semiconductor layer is a gallium arsenide (GaAs) layer, and wherein forming the grading layer comprises forming the grading layer between the AlGaAs layer and the GaAs layer.

10. The method of claim 1, wherein the first semiconductor layer is an aluminum gallium arsenide phosphide (AlGaAsP) layer, and the second semiconductor layer is a gallium arsenide (GaAs) layer, and wherein forming the grading layer comprises forming the grading layer between the AlGaAsP layer and the GaAs layer.

11. The method of claim 1, wherein the first semiconductor layer is a silicon (Si) layer, and the second semiconductor layer is a silicon germanium (SiGe) layer, and wherein forming the grading layer comprises forming the grading layer between the Si layer and the SiGe layer.

12. The method of claim 1, wherein the first semiconductor layer is an aluminum gallium nitride (AlGaN) layer, and the second semiconductor layer is a gallium nitride (GaN) layer, and wherein forming the grading layer comprises forming the grading layer between the AlGaN layer and the GaN layer.

13. The method of claim 1, wherein the first semiconductor layer is a gallium nitride (GaN) layer, and the second semiconductor layer is an indium gallium nitride (InGaN) layer, and wherein forming the grading layer comprises forming the grading layer between the GaN layer and the InGaN layer.

14. An electro-optical semiconductor device comprising:
a first semiconductor layer disposed on one or more semiconductor layers, wherein the first semiconductor layer comprises a first bandgap value;
a grading layer disposed on the first semiconductor layer, wherein the grading layer comprises a plurality of layers defining a continuous compositional grading; and
a second semiconductor layer disposed on the grading layer, wherein the second semiconductor layer comprises a second bandgap value, and
wherein the second bandgap value is different than the first bandgap value.

15. The electro-optical semiconductor device of claim 14, wherein a difference between the first bandgap and the second bandgap is greater than or equal to 0.1 eV.

16. The electro-optical semiconductor device of claim 14, wherein the continuous compositional grading corresponds to a linear compositional grading between the first semiconductor layer and the second semiconductor layer.

17. The electro-optical semiconductor device of claim 14, wherein the continuous compositional grading comprises a step size that is approximately equal to zero.

18. A transceiver device comprising:
an electro-optical semiconductor device comprising:
a first semiconductor layer disposed on one or more semiconductor layers, wherein the first semiconductor layer comprises a first bandgap value;
a grading layer disposed on the first semiconductor layer, wherein the grading layer comprises a plurality of layers defining a continuous compositional grading; and
a second semiconductor layer disposed on the grading layer, wherein the second semiconductor layer comprises a second bandgap value that is different than the first bandgap value, wherein the electro-optical semiconductor device is configured to generate output data based on an optical input signal received by the electro-optical semiconductor device; and
a controller device operably coupled with the electro-optical semiconductor device and configured to process the output data generated by the electro-optical semiconductor device.

19. The transceiver device of claim 18, wherein a difference between the first bandgap and the second bandgap is greater than or equal to 0.1 eV.

20. The transceiver device of claim 18, wherein the continuous compositional grading comprises a step size that is approximately equal to zero.

* * * * *